United States Patent
Yu et al.

(10) Patent No.: US 9,728,602 B2
(45) Date of Patent: Aug. 8, 2017

(54) VARIABLE CHANNEL STRAIN OF NANOWIRE TRANSISTORS TO IMPROVE DRIVE CURRENT

(71) Applicant: Taiwan Semiconductor Manufacturing Company Limited, Hsinchu (TW)

(72) Inventors: Tsung-Hsing Yu, Taipei (TW); Yeh Hsu, Taoyuan County (TW); Chia-Wen Liu, Taipei (TW); Jean-Pierre Colinge, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/923,532

(22) Filed: Oct. 27, 2015

(65) Prior Publication Data

US 2016/0049472 A1  Feb. 18, 2016

Related U.S. Application Data

(63) Continuation of application No. 14/310,289, filed on Jun. 20, 2014, now Pat. No. 9,196,730.

(51) Int. Cl.
| | | |
|---|---|---|
| *H01L 29/06* | (2006.01) | |
| *H01L 29/78* | (2006.01) | |
| *H01L 29/423* | (2006.01) | |
| *H01L 21/28* | (2006.01) | |
| *H01L 29/66* | (2006.01) | |
| *H01L 29/775* | (2006.01) | |
| *H01L 29/49* | (2006.01) | |

(52) U.S. Cl.
CPC .... *H01L 29/0676* (2013.01); *H01L 21/28017* (2013.01); *H01L 29/4238* (2013.01); *H01L 29/42372* (2013.01); *H01L 29/42376* (2013.01); *H01L 29/42392* (2013.01); *H01L 29/4983* (2013.01); *H01L 29/66439* (2013.01); *H01L 29/66666* (2013.01); *H01L 29/775* (2013.01); *H01L 29/7827* (2013.01); *H01L 29/7845* (2013.01)

(58) Field of Classification Search
CPC ... H01L 21/28; H01L 21/28017; H01L 29/06; H01L 29/0676; H01L 29/1054; H01L 29/423; H01L 29/42376; H01L 29/4238; H01L 29/66; H01L 29/66439; H01L 29/66666; H01L 29/775; H01L 29/78; H01L 29/7827; H01L 29/7831; H01L 29/7845

See application file for complete search history.

(56) References Cited

U.S. PATENT DOCUMENTS

| | | | |
|---|---|---|---|
| 6,943,407 B2 | 9/2005 | Ouyang et al. | |
| 7,504,693 B2 * | 3/2009 | Zhu | H01L 21/28035 257/288 |

(Continued)

*Primary Examiner* — Allan R Wilson
(74) *Attorney, Agent, or Firm* — Jones Day

(57) ABSTRACT

A semiconductor device includes a nanowire structure and a stressor. The nanowire structure includes a first channel section and a second channel section. The stressor subjects the first channel section to a first strain level and the second channel section to a second strain level greater than the first strain level. The difference between the second strain level and the first strain level is less than the second strain level.

20 Claims, 14 Drawing Sheets

(56) References Cited

U.S. PATENT DOCUMENTS

| | | |
|---|---|---|
| 8,372,713 B2 | 2/2013 | Masuoka et al. |
| 8,569,832 B2 | 10/2013 | Lee |
| 2004/0157353 A1 | 8/2004 | Ouyang et al. |
| 2006/0043500 A1* | 3/2006 | Chen .................. H01L 29/7843 257/401 |
| 2006/0246672 A1* | 11/2006 | Chen .................. H01L 29/7843 438/301 |
| 2009/0166725 A1 | 7/2009 | Lee |
| 2009/0224293 A1* | 9/2009 | Miyanami ........... H01L 21/3105 257/288 |
| 2012/0080745 A1 | 4/2012 | Lee |
| 2012/0319190 A1 | 12/2012 | Zhu et al. |
| 2013/0015500 A1 | 1/2013 | Izumida et al. |
| 2014/0225184 A1 | 8/2014 | Colinge et al. |
| 2014/0264632 A1* | 9/2014 | Richter ............. H01L 29/66795 257/401 |

* cited by examiner

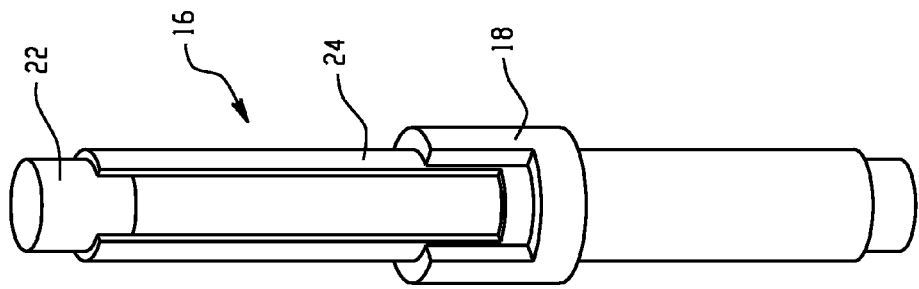
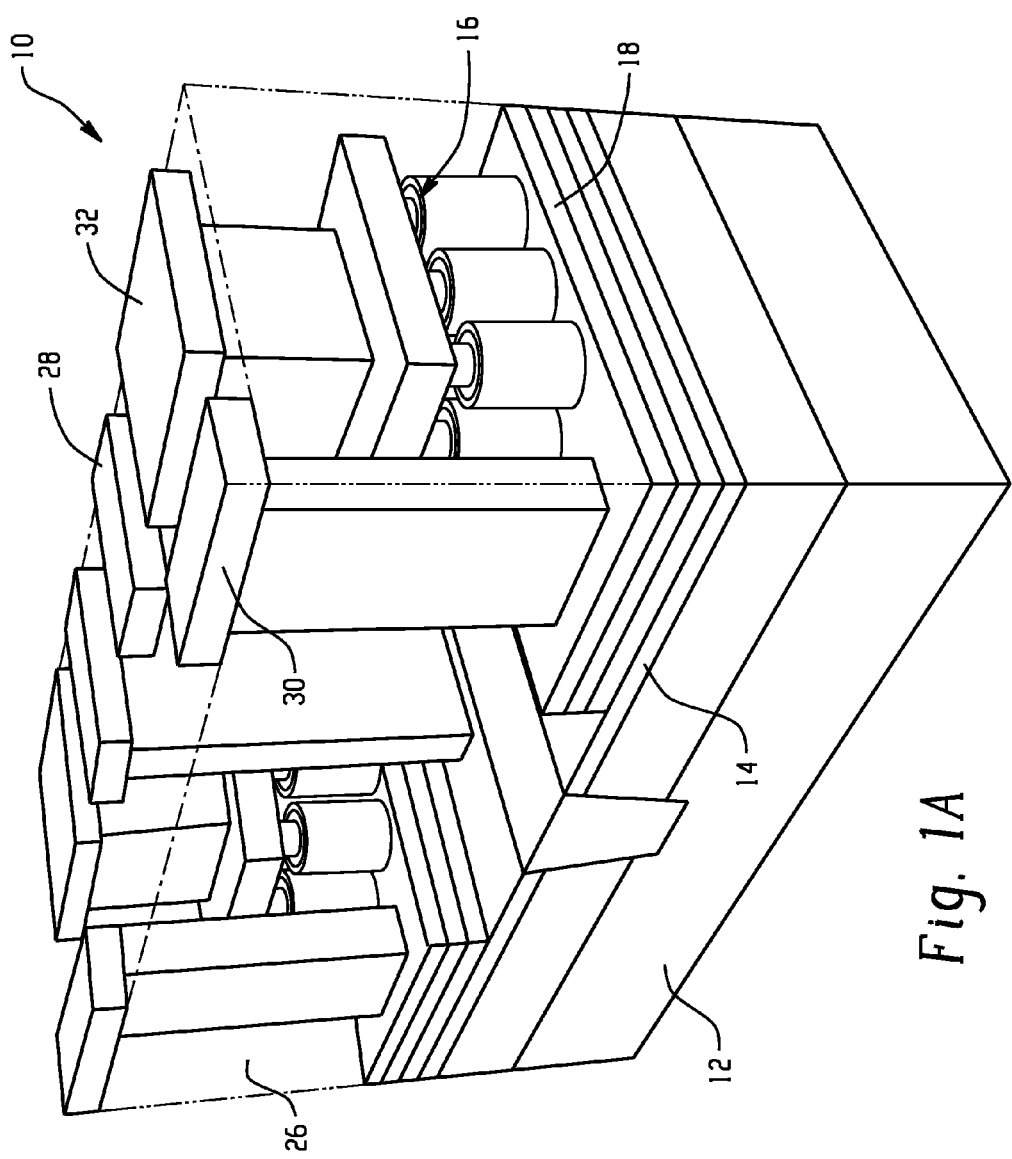

VARIABLE CHANNEL STRAIN OF NANOWIRE TRANSISTORS TO IMPROVE DRIVE CURRENT

CROSS-REFERENCE TO A RELATED APPLICATION

This application is a continuation application of U.S. patent application Ser. No. 14/310,289, filed Jun. 20, 2014, which is incorporated herein by reference in its entirety.

BACKGROUND

The technology described in this patent document relates generally to semiconductor devices and more particularly to nanowire semiconductor devices.

Scaling of semiconductor devices, such as a metal-oxide semiconductor field-effect transistor (MOSFET), has enabled continued improvement in speed, performance, density, and cost per unit function of integrated circuits over the past few decades. Development of nanowire devices can further the scaling of integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a diagram of an example semiconductor device that is formed using nanowire technology, in accordance with some embodiments.

FIG. 1B is a diagram of an example nanowire structure, in accordance with some embodiments.

DETAILED DESCRIPTION

Figure 2A:
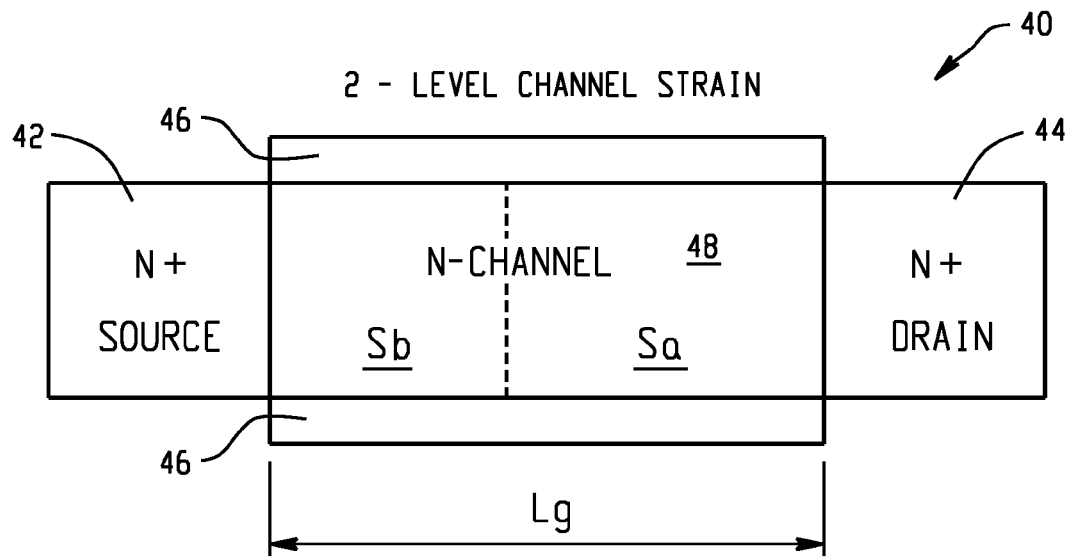
FIG. 2A is a diagram of an example N-channel semiconductor device having a channel formed from nanowire material, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a block diagram of an example semiconductor device 10 that is formed using nanowire technology. The device is fabricated on a substrate 12. In this example, the substrate 12 comprises a bulk substrate, although other substrate structures such as silicon-on-insulator (SOI) may be used. In some embodiments the bulk substrate can include an elementary semiconductor including silicon or germanium in crystal, polycrystalline, or an amorphous structure; a compound semiconductor including silicon carbide, gallium arsenide, gallium phosphide, indium phosphide, indium arsenide, and indium antimonide; an alloy semiconductor including SiGe, SiGeSn, GeSn, GaAsP, AlInAs, AlGaAs, GaInAs, GaInP, and GaInAsP; any other suitable material; or combinations thereof. In some embodiments the bulk substrate can include p-type material and in other embodiments the bulk substrate can include n-type material. The substrate 12 may include isolation regions, doped regions, and/or other features.

The example semiconductor device 10 further includes a source region 14 in the substrate 12, one or more nanowire structures 16, and gate material 18 above the substrate and surrounding a middle portion of the nanowire structures 16. FIG. 1B depicts an example nanowire structure 16 that may be implemented in the example semiconductor device 10 of FIG. 1A. The nanowire structures 16 in this example are oriented in a vertical direction and extend upwardly from the source region 14. In other examples, the nanowire structures may extend in other directions such as a horizontal direction. Also, although nanowires with a circular cross-sectional shape are shown in this example, in other examples the cross-sectional shape may include circular, square, rectangular, triangular, trapezoidal, or other shapes. The example nanowire structure 16 comprises semiconductor material such as silicon that is used to form a channel region between the source region 14 and a drain region 22. The drain region 22 in this example is at the far end section of the nanowire structure 16 opposite the source region 14 and may comprise a metal silicide. Gate oxide 24 is also shown surrounding the nanowire structure 16.

The example semiconductor device 10 further includes insulation material 26 above the substrate 12 and surrounding the nanowire structures 16 and gate material 18. Metal contacts are also included in the semiconductor device 10. In this example, shown are a source contact 28, a gate contact 30 and a drain contact 32.

The number of nanowires needed in a design may be a function of the drive current required for the semiconductor device. By increasing the drive current per nanowire, the number of nanowires required to produce the desired drive current may be reduced.

It has been determined that drive current (I) is equal to total channel charge (nq) multiplied by the average carrier velocity (v) and can be expressed by the following formula: I=nqv. To increase the drive current in the example nanowire devices, band structure engineering can be applied to increase the average carrier velocity through the modulation of the channel electric field.

FIG. 2A depicts an example n-channel semiconductor structure 40 that can be implemented using a nanowire. The semiconductor structure 40 comprises a source region 42, a drain region 44, and a gate region 46 surrounding a nanowire structure that forms a channel 48 between the source region 42 and the drain region 44. The channel 48 has a total length $L_g$ and includes a first channel strain region Sa and a second channel strain region Sb. The first channel strain region Sa is more tensile than the second channel strain region Sb.

Figure 2B:
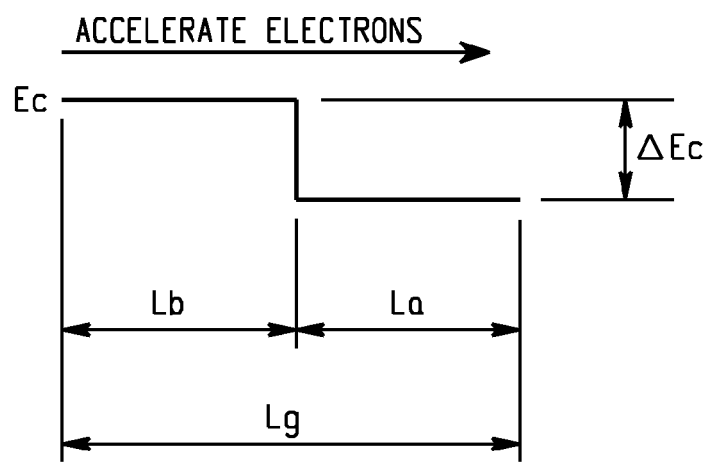
FIG. 2B is a diagram illustrating the relative levels of the conduction band level $E_c$ for the semiconductor device of FIG. 2A at different locations in the nanowire channel, in accordance with some embodiments.

FIG. 2B is a drawing that illustrates the effect of the different channel strain regions on the conduction band energy $E_c$ of the example nanowire channel of FIG. 2A for an electron that traverses the channel. Strain engineering is applied to alter the band edge leading to a band offset $\Delta E_c$. As an electron traverses the channel, the conduction band energy decreases. The band offset $\Delta E_c$ in the two channel sections can cause the flow of electrons from the second channel strain region Sb to the first channel strain region Sa to accelerate. The carrier velocity will be enhanced by the channel strain induced electric field at the channel strain section interface.

Figure 3A:
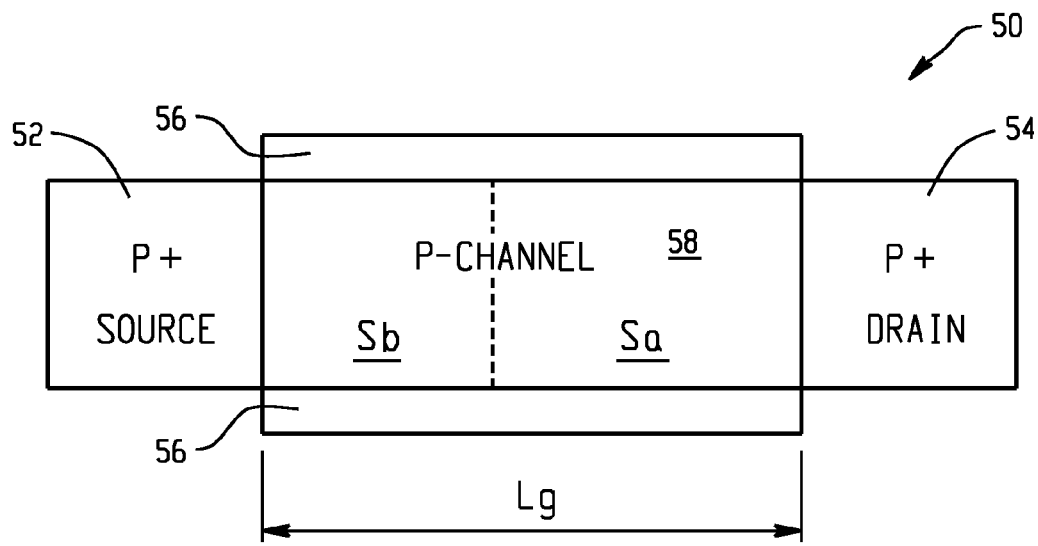
FIG. 3A is a diagram of an example P-channel semiconductor device having a channel formed from nanowire material, in accordance with some embodiments.

FIG. 3A depicts an example p-channel semiconductor structure 50 that can be implemented using a nanowire. The semiconductor structure 50 comprises a source region 52, a drain region 54, and a gate region 56 surrounding a nanowire structure that forms a channel 58 between the source region 52 and the drain region 54. The channel 58 has a total length $L_g$ and includes a first channel strain region Sa and a second channel strain region Sb. The first channel strain region Sa is more compressive than the second channel strain region Sb.

Figure 3B:
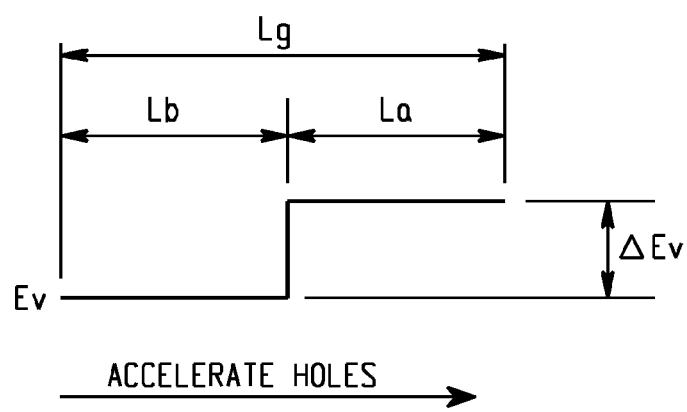
FIG. 3B is a diagram illustrating the relative levels of the valence band energy $E_v$ for the semiconductor device of FIG. 3A at different locations in the nanowire channel, in accordance with some embodiments.

FIG. 3B is a drawing that illustrates the effect of the different channel strain regions on the valence band energy $E_v$ of the example nanowire channel of FIG. 3A for a hole that traverses the channel. Strain engineering is applied to alter the band edge leading to a band offset $\Delta E_v$. As a hole traverses the channel, the valence band edge energy decreases. The band offset $\Delta E_v$ in the two channel sections can cause the flow of holes from the second channel strain region Sb to the first channel strain region Sa to accelerate. The carrier velocity will be enhanced by the channel strain induced electric field at the channel strain section interface.

Figure 4:
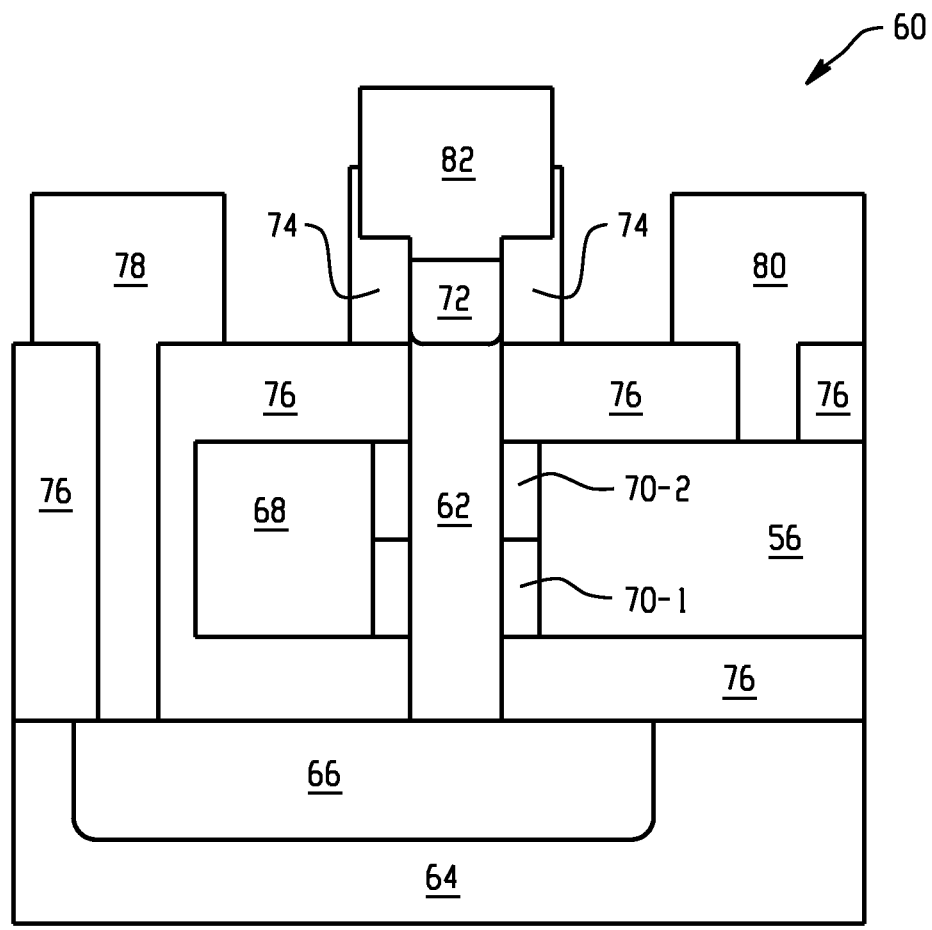
FIG. 4 is a cross sectional view of an example MOSFET semiconductor device with variable channel strain of nanowire transistor, in accordance with some embodiments.

Depicted in FIG. 4 is a cross sectional view of an example MOSFET semiconductor device 60 that includes a nanowire 62 with variable channel strain. The example MOSFET semiconductor device 60 may be fabricated using suitable processes including photolithography, etching, cleaning, chemical mechanical polishing/planarization (CMP), thin film deposition, thermal process (e.g., doping, activation/surface, passivation/material consolidation), epitaxy, and material filling, among others. For example, the photolithography process may include forming a photoresist layer (resist), exposing the resist to a pattern, performing post-exposure bake processes, and developing the resist to form a masking element. The masking element may then be used in an etching process. The etching may be performed using reactive ion etch (RIE) and/or other suitable processes.

The example MOSFET semiconductor device 60 includes a silicon substrate 64 with a doped region 66 which functions as a source region. The nanowire 62 is formed above the source region 66. The example MOSFET semiconductor device 60 further includes gate material 68 including a first stress metal film 70-1 surrounding a section of the nanowire 62 and a second stress metal film 70-2 surrounding a section of the nanowire 62. Although the gate 68 shown in this example has two different stress metal film sections, in other examples the gate 68 may have three or more different stress metal film sections. The example MOSFET semiconductor device 60 also includes a drain region 72 comprising a metal silicide at the end of the nanowire 62 opposite the source region 66 and nitride spacers 74 surrounding the drain region 72. The MOSFET semiconductor device 60 also includes insulator material 76 and metal contacts. The metal contacts include a source contact 78, a gate contact 80, and a drain contact 82. Although a NMOS device is shown, in other examples a PMOS device could be implemented.

Figure 5:
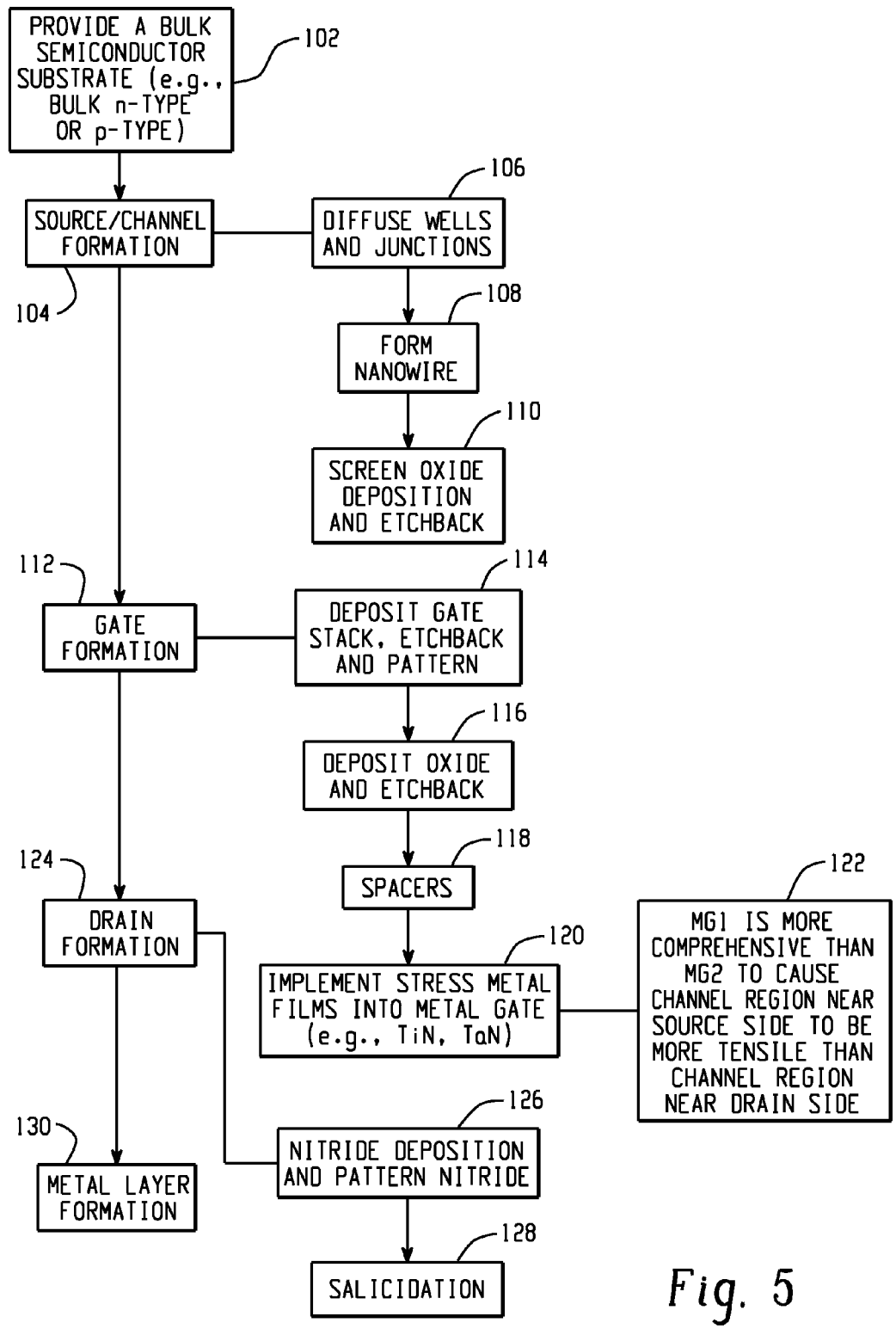
FIG. 5 is a process flow chart depicting an example method for generating a semiconductor device with variable channel strain of nanowire transistor, in accordance with some embodiments.

FIG. 5 is a process flow chart depicting an example method for generating a semiconductor device structure having a nanowire with variable channel strain. A semiconductor substrate is provided (operation 102). The substrate may be a bulk substrate such as a bulk n-type or bulk p-type substrate. Other substrates may also be used such as a semiconductor-on-insulator substrate.

The source and channel regions of the semiconductor device are formed (operation 104). Source formation may involve operations such as well and junction diffusion (operation 106) and N+ and P+ implantation to form a source region in the semiconductor substrate. The channel region may be fabricated from one or more nanowires (operation 108), for example, using deposition operations.

Figure 6:
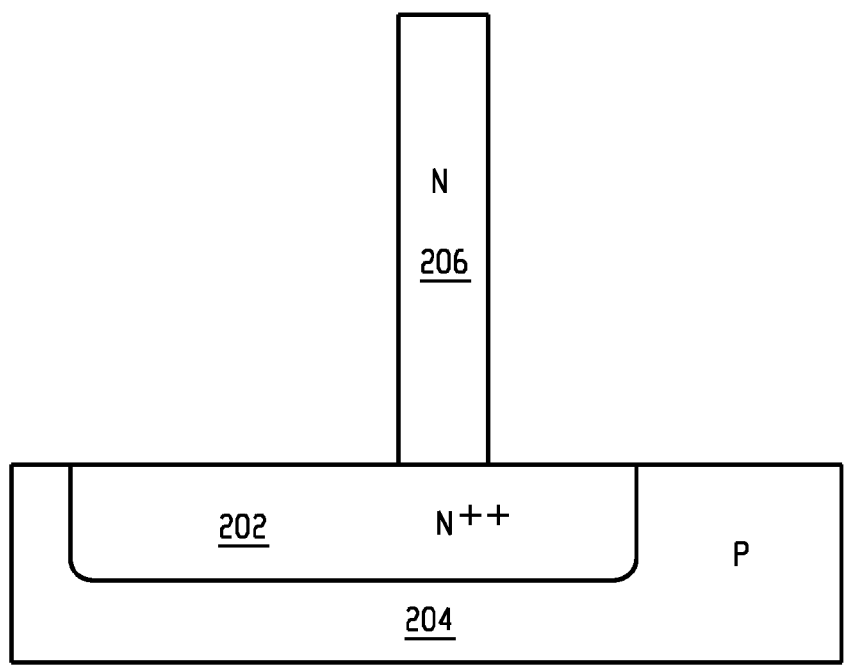
FIGS. 6-9 are drawings depicting example states of a semiconductor structure during fabrication of a semiconductor device with variable channel strain of nanowire transistor, in accordance with some embodiments.

FIG. 6 depicts a cross sectional view of a portion of a semiconductor device after source 202 formation in the substrate 204 and formation of the nanowire 206. The nanowire 206 may be formed from a semiconductor material such as silicon or other suitable semiconductor material.

Referring back to FIG. 5, after the nanowire is formed, screen oxide deposition and etchback (operation 110) and gate formation operations may take place (operation 112). Gate formation operations may involve gate stack, etchback, and pattern operations (operation 114), oxide deposition and etchback (operation 116), spacers deposition (operation 118), and implementing stress metal films into the metal gate (operation 120).

Figure 7:
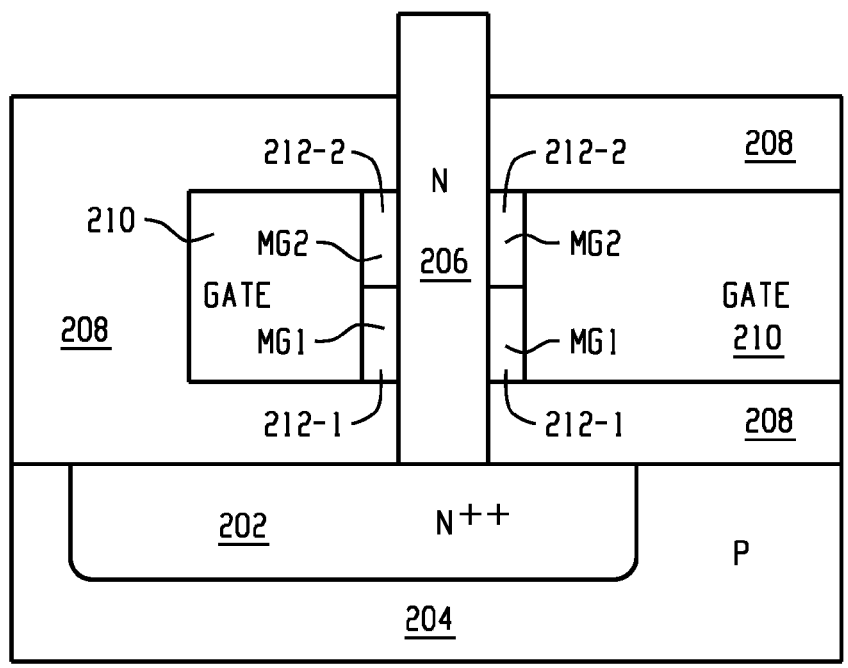

FIG. 7 depicts a cross sectional view of a portion of a semiconductor device after gate formation operations. Shown are deposited oxide 208, the gate 210, spacers, and metal films 212-1, 212-2, respectfully referred to as MG1 and MG2. The second metal film MG2 is more compressive than the first metal film MG1, which causes the channel region adjacent the drain to be more tensile than the channel region adjacent to the source.

Figure 8:
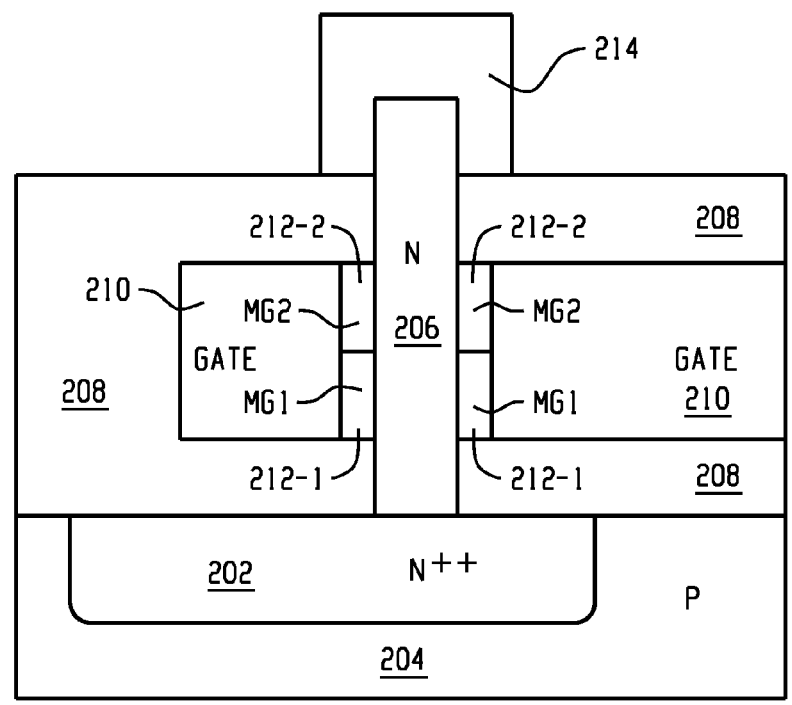

Referring back to FIG. 5, after gate formation operations, drain formation operations (operation 124) may occur. Drain formation may involve nitride spacer formation (operation 126) and salicidation operations (operation 128) wherein silicide is formed at the end of the nanowire section opposite the substrate. Nitride spacer formation may involve nitride deposition and patterning operations. FIG. 8 depicts a cross sectional view of a portion of a semiconductor device after nitride patterning and illustrates the deposited nitride spacers 214.

Figure 9:
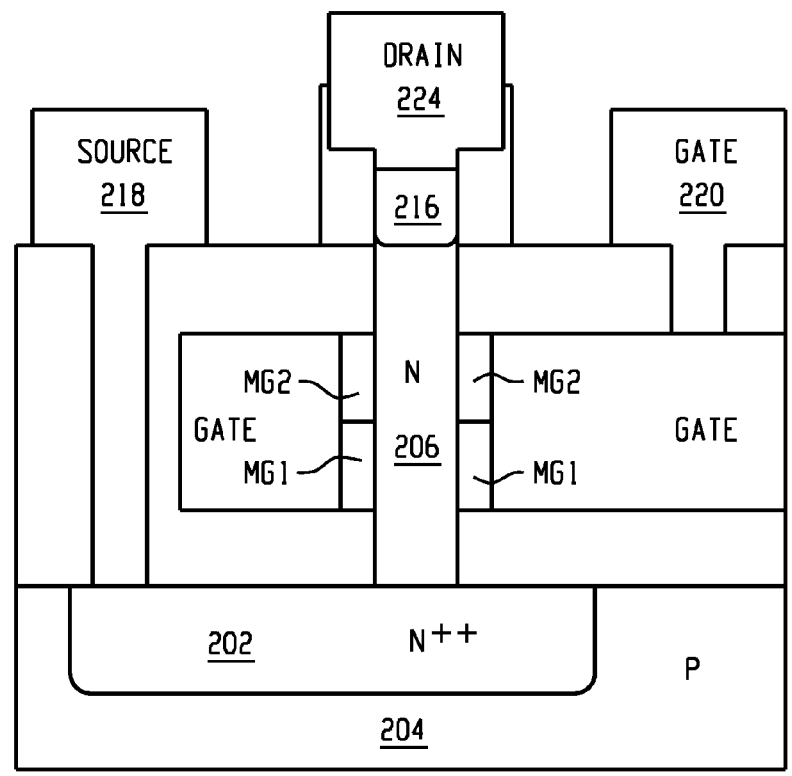

Referring back to FIG. 5, finally, metallization operations (operation 130) are shown where metal contacts are added to the drain, source, and gate regions of the transistor device. FIG. 9 depicts a cross sectional view of a portion of a semiconductor device after salicidation and metallization. The figure illustrates silicide 216 formed at the end of the second nanowire section 206 opposite the substrate 204 and metal contacts added to the drain, source, and gate regions of the transistor device. Shown are source contact 218, gate contact 220, and drain contact 224.

Figure 10:
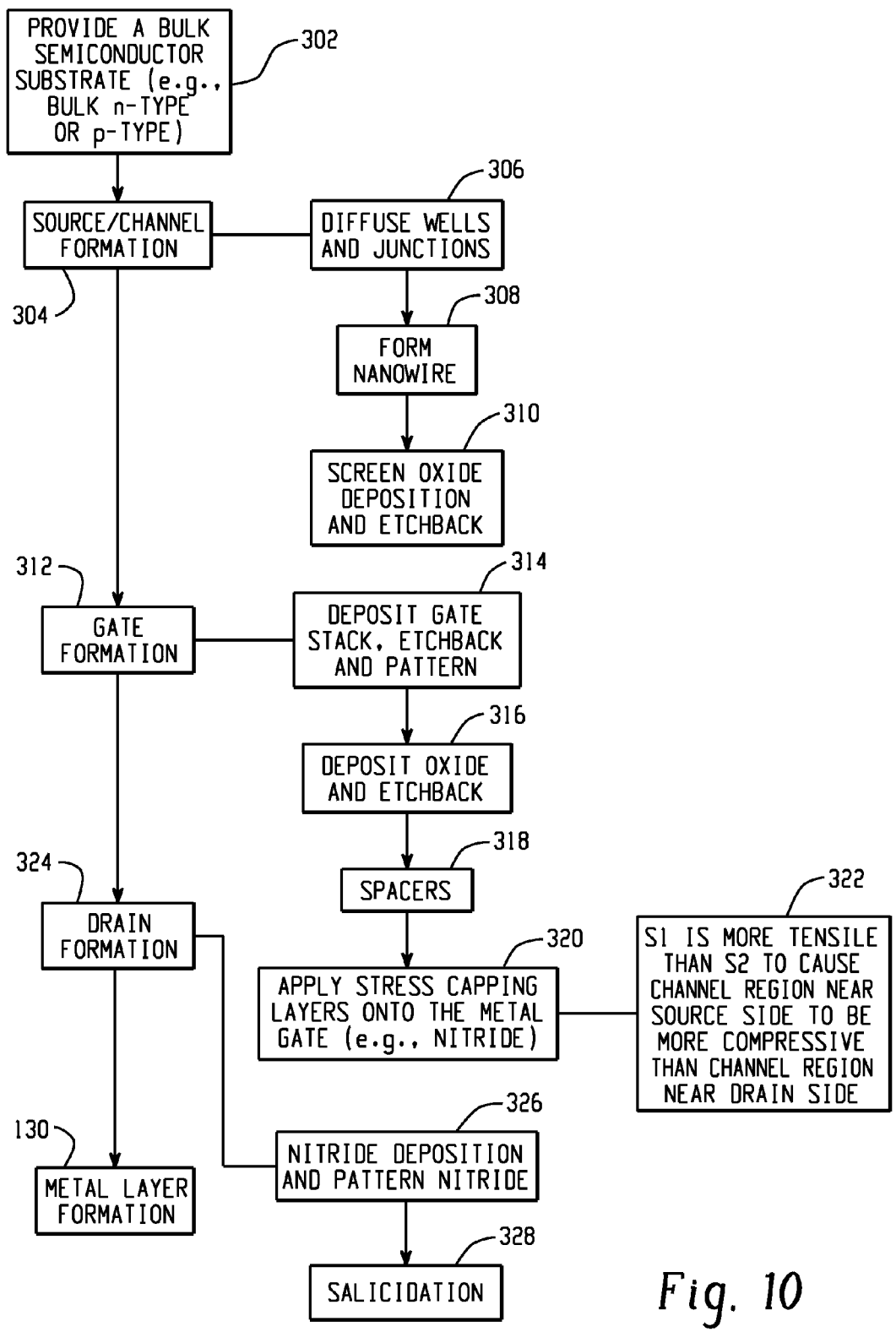
FIG. 10 is a process flow chart depicting another example method for generating a semiconductor device with variable channel strain of nanowire transistor, in accordance with some embodiments.

FIG. 10 is a process flow chart depicting another example method for generating a semiconductor device structure having a nanowire with variable channel strain. A semiconductor substrate is provided (operation 302). The substrate may be a bulk substrate such as a bulk n-type or bulk p-type substrate. Other substrates may also be used such as a semiconductor-on-insulator substrate.

The source and channel regions of the semiconductor device are formed (operation 304). Source formation may involve operations such as well and junction diffusion (operation 306) and N+ and P+ implantation to form a source region in the semiconductor substrate. The channel region may be fabricated from one or more nanowires (operation 308), for example, using deposition operations.

Figure 11:
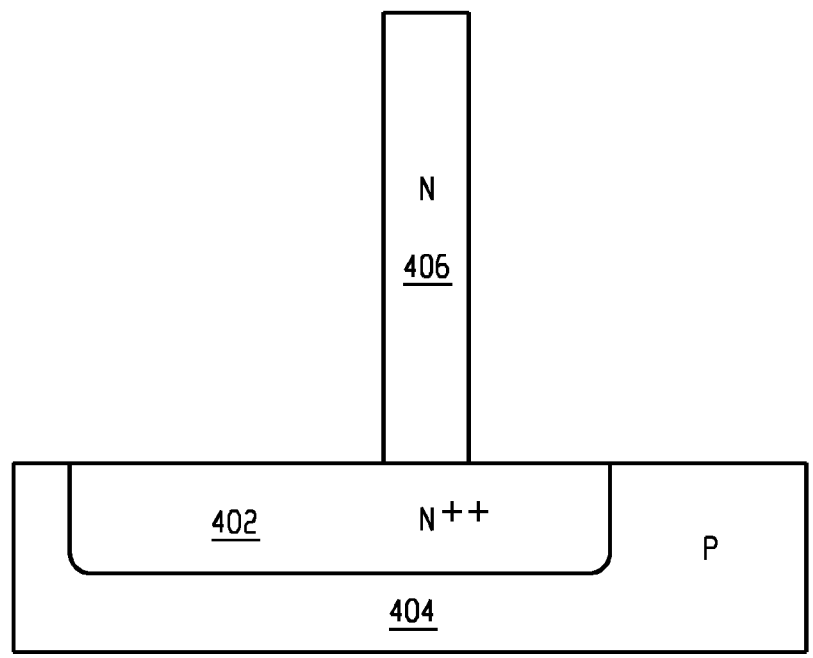
FIGS. 11-14 are drawings depicting example states of a semiconductor structure during fabrication of a semiconductor device with variable channel strain of nanowire transistor, in accordance with some embodiments.

FIG. 11 depicts a cross sectional view of a portion of a semiconductor device after source 402 formation in the substrate 404 and formation of the nanowire 406. The nanowire 406 may be formed from a semiconductor material such as silicon or other suitable semiconductor material.

Referring back to FIG. 10, after the nanowire is formed, screen oxide deposition and etchback (operation 310) and gate formation operations may take place (operation 312). Gate formation operations may involve gate stack, etchback, and pattern operations (operation 314), oxide deposition and etchback (operation 316), spacers deposition (operation 318), and applying stress capping layers onto the top of the metal gate (operation 320).

Figure 12:
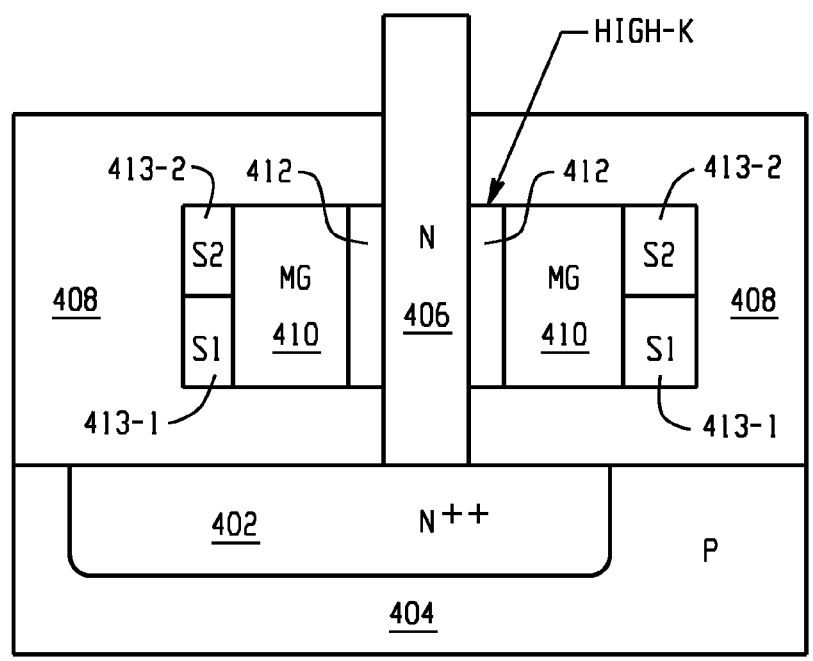

FIG. 12 depicts a cross sectional view of a portion of a semiconductor device after gate formation operations. Shown are deposited oxide 408, the gate 410, spacers 412, and stressor films 413-1, 413-2 comprising nitride or $SiO_2$, respectfully referred to as S1 and S2. The second stressor film S2 is more tensile than the first stressor film S1, which causes the channel region adjacent the drain to be more tensile than the channel region adjacent to the source.

Figure 13:
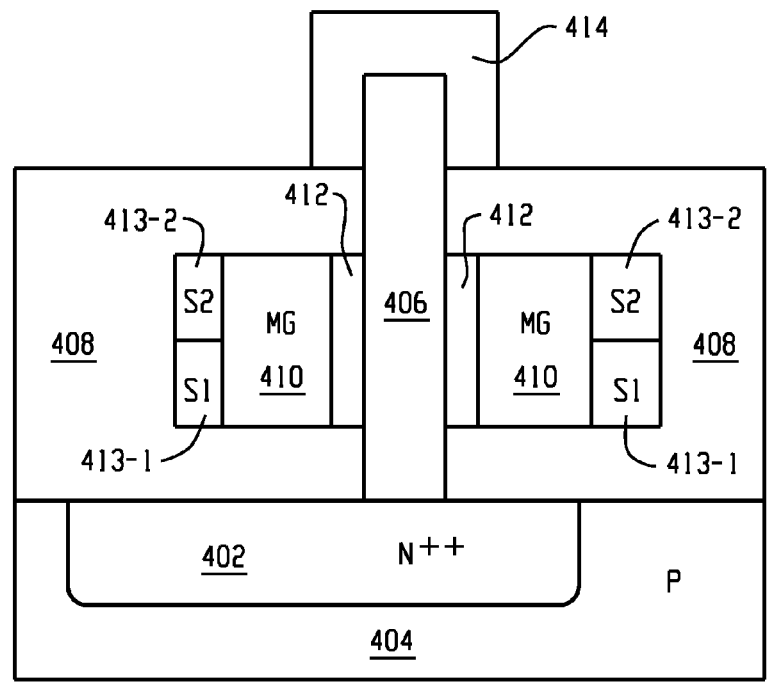

Referring back to FIG. 10, after gate formation operations, drain formation operations (operation 324) may occur. Drain formation may involve nitride spacer formation (operation 326) and salicidation operations (operation 328) wherein silicide is formed at the end of the nanowire section opposite the substrate. Nitride spacer formation may involve nitride deposition and patterning operations. FIG. 13 depicts a cross sectional view of a portion of a semiconductor device after nitride patterning and illustrates the deposited nitride spacers 414.

Figure 14:
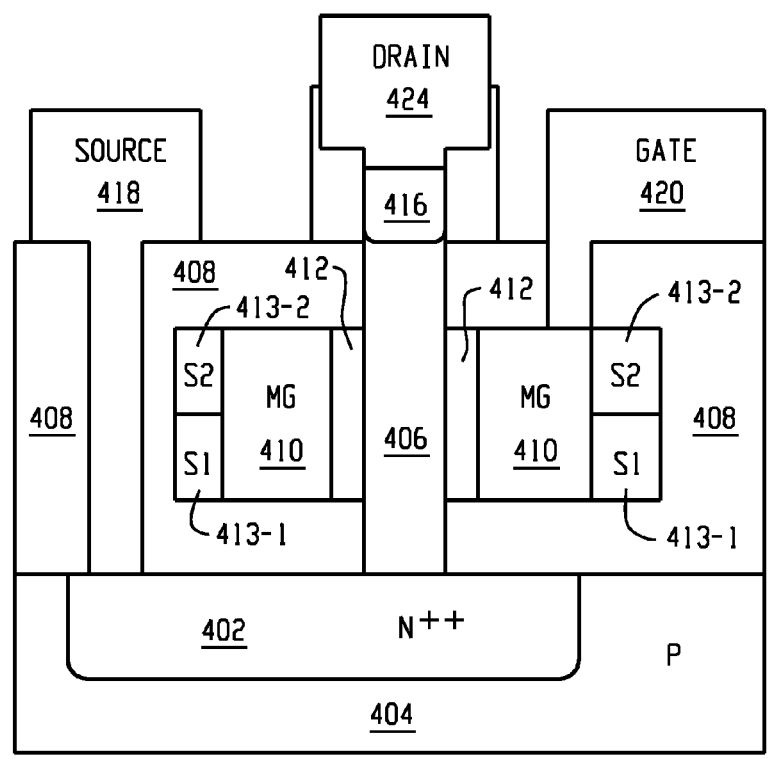

Referring back to FIG. 10, finally, metallization operations (operation 330) are shown where metal contacts are added to the drain, source, and gate regions of the transistor device. FIG. 14 depicts a cross sectional view of a portion of a semiconductor device after salicidation and metallization. The figure illustrates silicide 416 formed at the end of the nanowire 406 opposite the substrate 404 and metal contacts added to the drain, source, and gate regions of the transistor device. Shown are source contact 418, gate contact 420, and drain contact 424.

Figure 15:
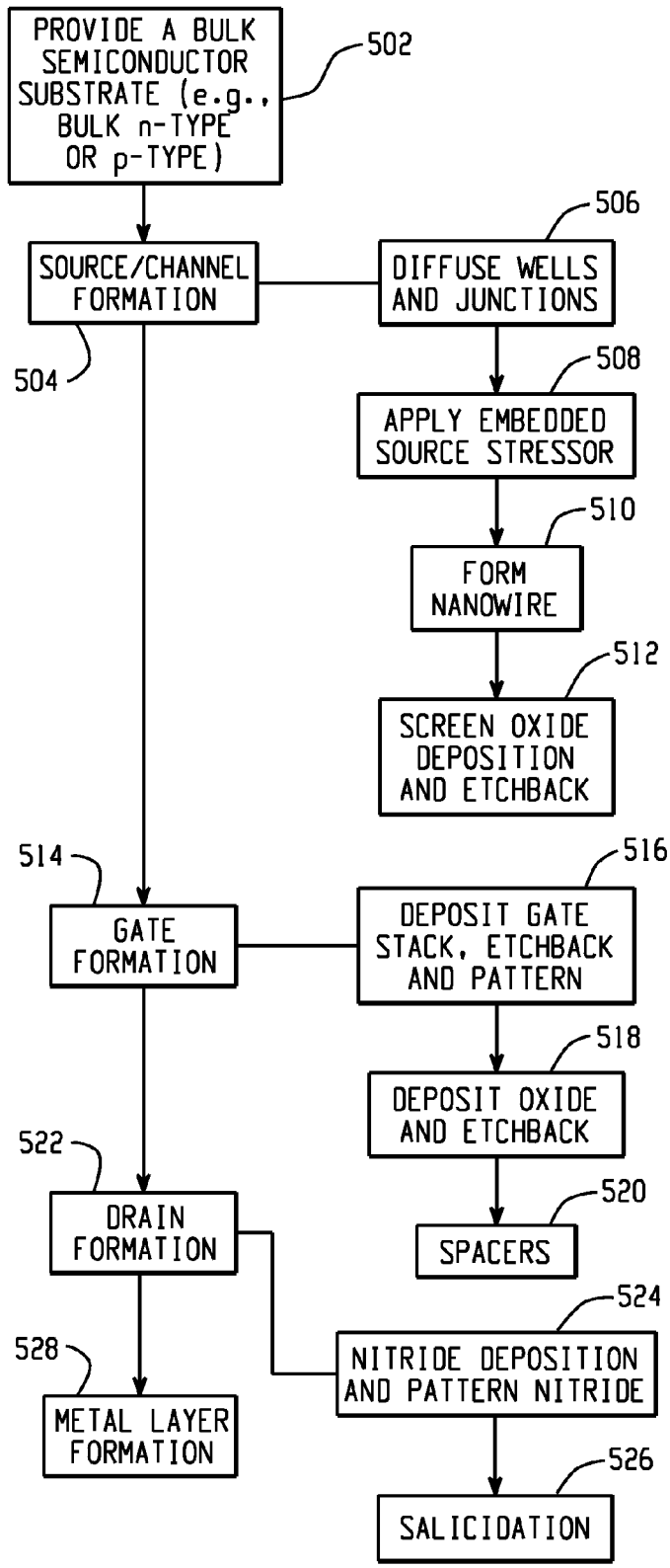
FIG. 15 is a process flow chart depicting another example method for generating a semiconductor device with variable channel strain of nanowire transistor, in accordance with some embodiments.

FIG. 15 is a process flow chart depicting another example method for generating a semiconductor device structure having a nanowire with variable channel strain. A semiconductor substrate is provided (operation 502). The substrate may be a bulk substrate such as a bulk n-type or bulk p-type substrate. Other substrates may also be used such as a semiconductor-on-insulator substrate.

The source and channel regions of the semiconductor device are formed (operation 504). Source formation may involve operations such as well and junction diffusion (operation 506) and N+ and P+ implantation to form a source region in the semiconductor substrate. Embedded drain stressors can be fabricated in the drain region (operation 508), for example, by epitaxial growth operations. The channel region may be fabricated from one or more nanowires (operation 510), for example, using deposition operations.

Figure 16:
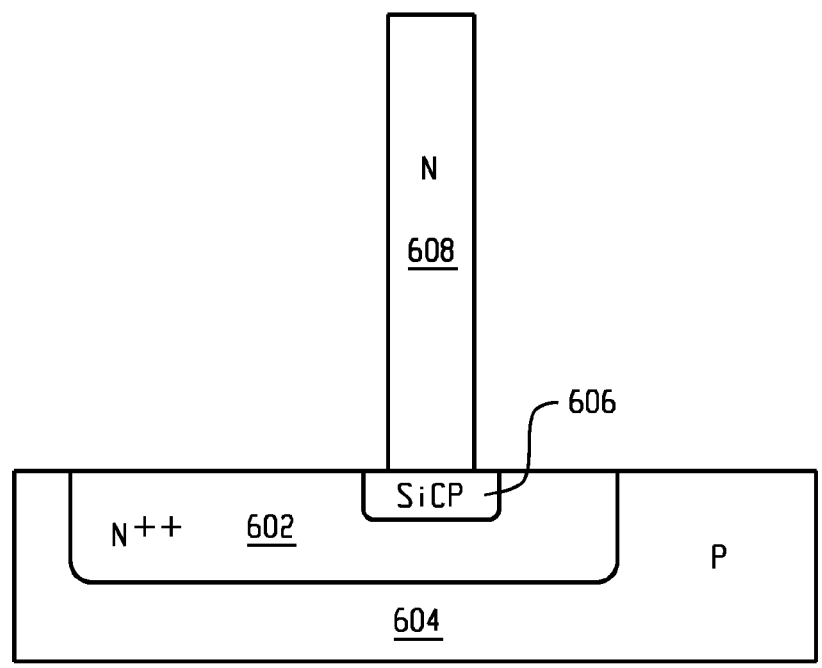
FIGS. 16-19 are drawings depicting example states of a semiconductor structure during fabrication of a semiconductor device with variable channel strain of nanowire transistor, in accordance with some embodiments.

FIG. 16 depicts a cross sectional view of a portion of a semiconductor device after source 602 formation in the substrate 604, formation of the embedded drain stressors 606, and formation of the nanowire 608. The embedded drain stressors may be formed from a material such as SiCP material. The nanowire 606 may be formed from a semiconductor material such as silicon or other suitable semiconductor material.

Referring back to FIG. 15, after the nanowire is formed, screen oxide deposition and etchback (operation 512) and gate formation operations may take place (operation 514). Gate formation operations may involve gate stack, etchback, and pattern operations (operation 516), oxide deposition and etchback (operation 518), and spacers deposition (operation 520).

Figure 17:
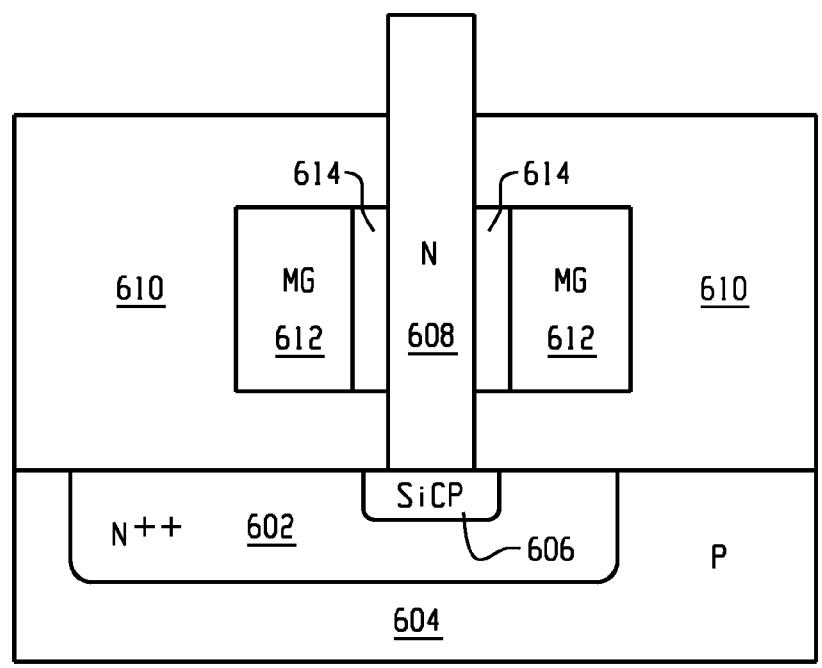

FIG. 17 depicts a cross sectional view of a portion of a semiconductor device after gate formation operations. Shown are deposited oxide 610, the gate 612, and the high-K dielectric 614.

Figure 18:
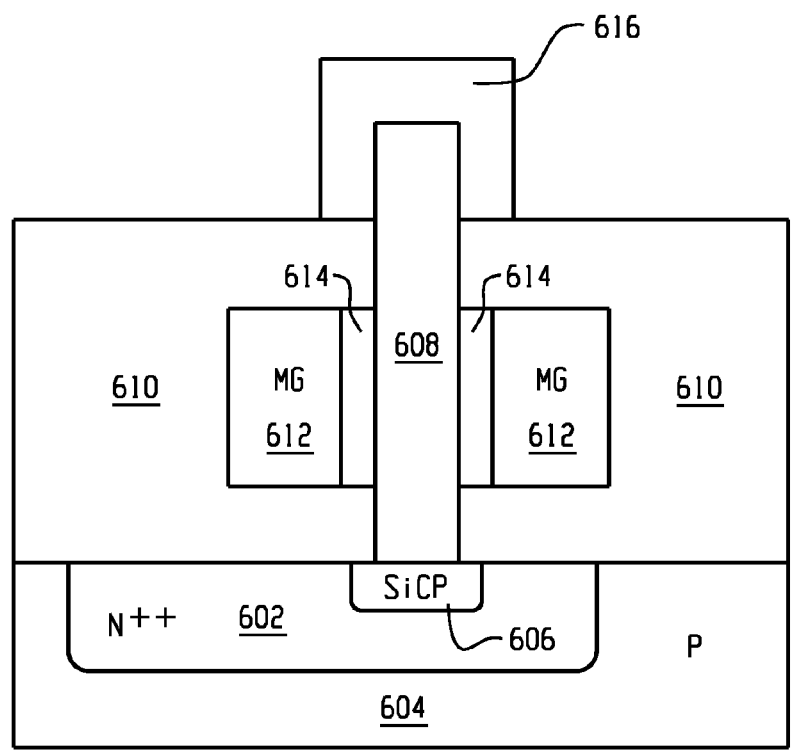

Referring back to FIG. 15, after gate formation operations, drain formation operations (operation 522) may occur. Drain formation may involve nitride spacer formation (operation 524) and salicidation operations (operation 526) wherein silicide is formed at the end of the nanowire section opposite the substrate. Nitride spacer formation may involve nitride deposition and patterning operations. FIG. 18 depicts a cross sectional view of a portion of a semiconductor device after nitride patterning and illustrates the deposited nitride spacers 616.

Figure 19:
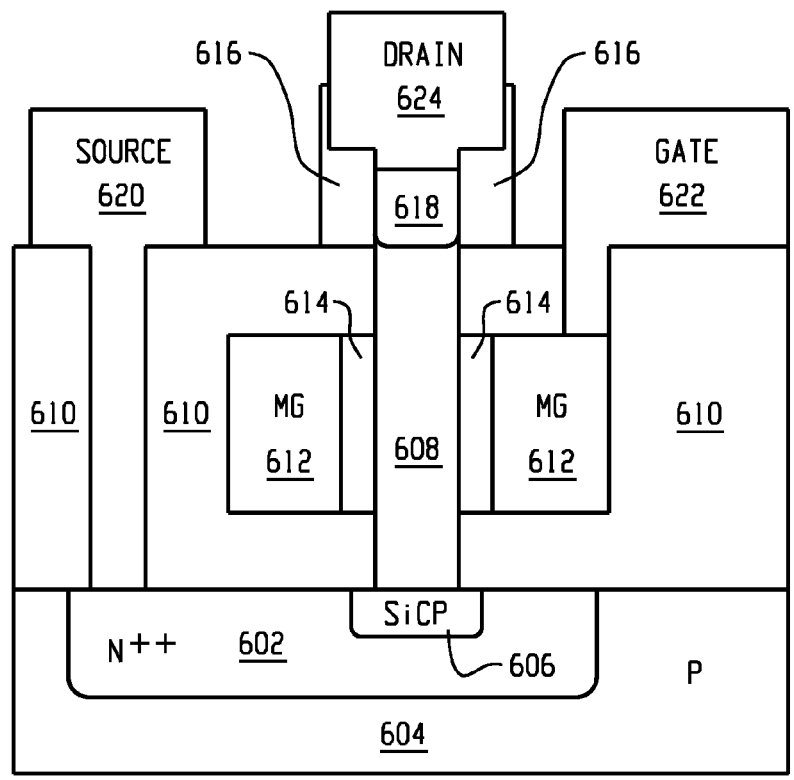

Referring back to FIG. 15, finally, metallization operations (operation 528) are shown where metal contacts are added to the drain, source, and gate regions of the transistor device. FIG. 19 depicts a cross sectional view of a portion of a semiconductor device after salicidation and metallization. The figure illustrates silicide 618 formed at the end of the nanowire 606 opposite the substrate 604 and metal contacts added to the drain, source, and gate regions of the transistor device. Shown are source contact 620, gate contact 622, and drain contact 624.

Figure 20:
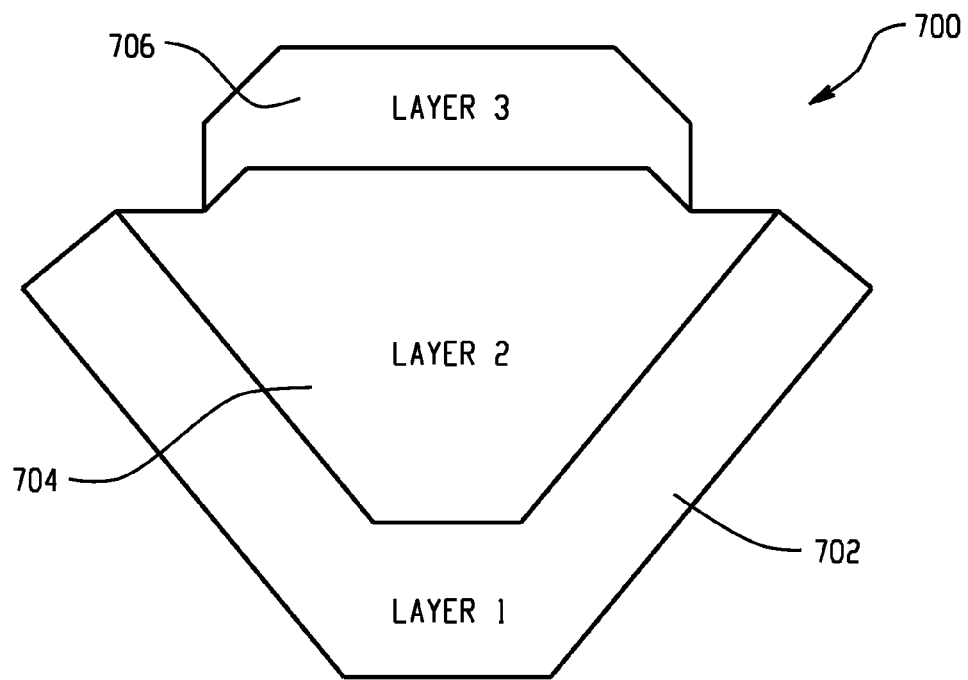
FIG. 20 depicts a cross sectional view of an example embedded source stressors, in accordance with some embodiments.

FIG. 20 depicts a cross sectional view of an example embedded drain stressors 700. The example embedded drain stressors comprise three layers: a layer 1 702, a layer 2 704, and a layer 3 706. The example embedded drain stressors 700 may have the following characteristics:

Layer 1: B undoped or B<1e19 cm$^{-3}$, [Ge] gradient A-B %, A<B, 10%<A<30%, 15%<B<40% or constant [Ge} mole fraction=B, 5 nm<layer 1 thk<25 nm Layer 2: 5e19<B<5e20 cm$^{-3}$, [Ge] gradient A-B %, A<B, 20%<A<50%, 30%<B<60% or constant [Ge} mole fraction=B, 10 nm<layer 2 thk<40 nm Layer 3: 3e20<B<5e21, [Ge]<50%, 5 nm<layer 3 thk<20 nm Embedded drain stressors may consist of SiCP for n-channel devices and Si(1−x)Ge(x) for p-channel devices. Due to the lattice constant mismatch between the drain stressors and the Si channel, the channel region near the drain side will induce uniaxial tensile stress and uniaxial compressive stress for n-channel and p-channel devices, respectively. For example, the Si(1−x)Ge(x) lattice constant is larger than the Si lattice constant resulting in compressive channel stress near the drain side. Therefore, channel stress will gradually change from neutral to compressive stress from source to drain side for a p-channel device. Because of the variable channel stress in the channel, the band offset will induce the electric field to accelerate holes from source to drain leading to an increase of drive current. Similarly, the SiCP lattice constant is smaller than that the Si lattice constant resulting in a tensile channel stress near the drain side for an n-channel device.

Figure 21:
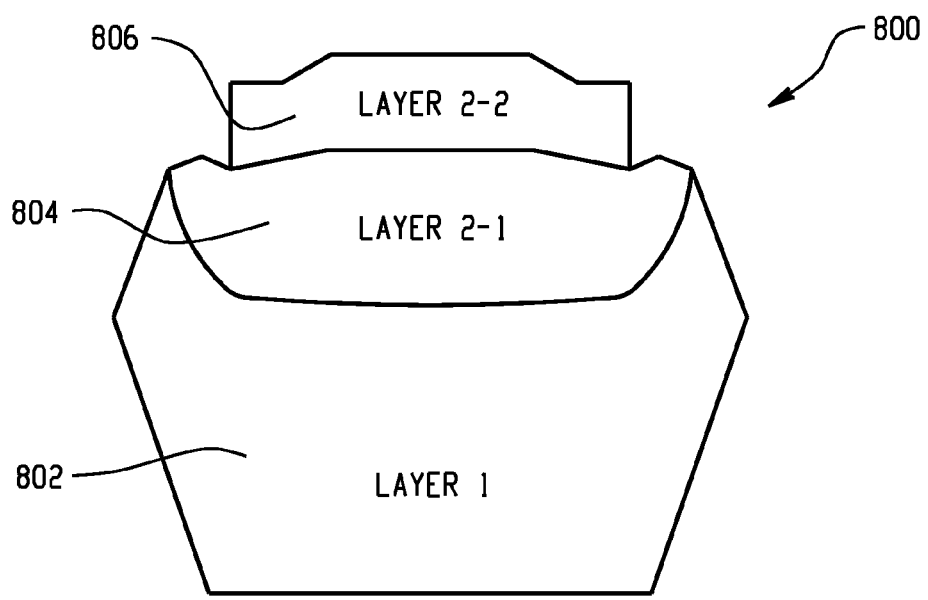
FIG. 21 depicts a cross sectional view of another example embedded source stressors, in accordance with some embodiments.

FIG. 21 depicts a cross sectional view of an example embedded source stressors 800. The example embedded source stressors comprise three layers: a layer 1 802, a layer 2-1 804, and a layer 2-2 806. The example embedded source stressors 800 may have the following characteristics:

Layer 1: 1e20<P<3e20 cm$^{-3}$, [C]<5%, 10 nm<layer 1 thk<25 nm

Layer 2-1: 2e20<P<7e20, 3 nm<layer 2-1 thk<15 nm

Layer 2-2: 3e20<P<5e21, 5 nm<layer 2-2 thk<25 nm

The foregoing examples provide semiconductor structures comprising nanowire transistors with variable strain within the nanowire channel. In the foregoing examples, the channel strain may change from source to drain to alter the band edge to achieve a band offset ΔEc for electrons or ΔEv for holes along the channel direction. For n-channel devices, the conduction band edge shift $\Delta E_c$ within the channel leads to electron acceleration to the drain electrode. For p-channel devices, the valence band edge shift $\Delta E_v$ within the channel causes hole acceleration to the drain electrode. In the foregoing examples the carrier velocity may be enhanced by the strain induced electric field at the interface. Implementation of the described techniques may improve (increase) the channel electric field, may improve carrier velocity, and may improve drive current without additional power consumption or boosting the supply voltage.

In one example, two level channel strain may be achieved by depositing stress metal films into the metal gate. In this example, the second stress metal film MG2 should be more compressive than the first stress metal film MG1, which causes the channel region near the drain side to be more tensile than that near the source side. In another example, two level channel strain may be achieved using stress capping layers deposited on top of the metal gate. In this example, the second capping layer S2 should be more tensile than the first capping layer S1, which causes the channel region near the drain side to be more tensile than that near the source side.

In one embodiment, a semiconductor device is provided. The semiconductor device comprises a nanowire structure that includes a first channel section and a second channel section, and a stressor that subjects the first channel section to a first strain level and the second channel section to a second strain level greater than the first strain level. The difference between the second strain level and the first strain level is less than the second strain level.

In another embodiment, a method is provided. The method comprises: providing a semiconductor device that includes a nanowire structure; and subjecting a first channel section of the nanowire structure to a first strain level and a second channel section of the nanowire structure to a second strain level greater than the first strain level. The difference between the second strain level and the first strain level is less than the second strain level.

In another embodiment, a semiconductor device is provided. The semiconductor device comprises a source/drain region, a stressor at least a portion of which is disposed in the source/drain region, and a nanowire structure that extends from the stressor. The stressor subjects the nanowire structure to a strain level.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a nanowire structure including a first channel section and a second channel section; and
   a stressor subjecting the first channel section to a first strain level and the second channel section to a second strain level greater than the first strain level, wherein the difference between the second strain level and the first strain level is less than the second strain level.

2. The semiconductor device of claim 1, further comprising a gate region disposed between the stressor and the nanowire structure.

3. The semiconductor device of claim 2, wherein the gate region surrounds the nanowire structure and the stressor surrounds the gate region.

4. The semiconductor device of claim 1, wherein the nanowire structure further includes a third channel section and the stressor further subjects the third channel section to a third strain level different from the first and second strain levels.

5. A method comprising:
providing a semiconductor device that includes a nanowire structure; and
subjecting a first channel section of the nanowire structure to a first strain level and a second channel section of the nanowire structure to a second strain level greater than the first strain level, wherein the difference between the second strain level and the first strain level is less than the second strain level.

6. The method of claim 5, wherein the subjecting a first channel section of the nanowire structure to a first strain level and a second channel section of the nanowire structure to a second strain level includes
forming a gate region on the nanowire structure, and
forming a stressor on the gate region.

7. The method of claim 6, wherein the forming a gate region on the nanowire structure includes surrounding the nanowire structure with the gate region and the forming a stressor on the gate region includes surrounding the gate region with the stressor.

8. The method of claim 5, further comprising subjecting a third channel section of the nanowire structure to a third strain level different from the first and second strain levels.

9. A semiconductor device comprising:
a channel region;
a stressor subjecting the channel region to different first and second strain levels;
a gate region between the channel region and the stressor; and
a nanowire structure that includes the channel region.

10. The semiconductor device of claim 9, wherein
the stressor includes first and second stressor films, and
the second stressor film is more tensile than the first stressor film.

11. The semiconductor device of claim 9, wherein the stressor includes nitrides.

12. The semiconductor device of claim 9, wherein the stressor includes $SiO_2$.

13. The semiconductor device of claim 9, wherein the nanowire structure further includes a first source/drain region and a second source/drain region, between which is the channel region, that are disposed one above the other.

14. The semiconductor device of claim 9, wherein the stressor surrounds the nanowire structure.

15. The semiconductor device of claim 9, wherein the channel region includes a first channel section that is subjected by the stressor to the first strain level and a second channel section that is subjected by the stressor to the second strain level.

16. A semiconductor device comprising:
a channel region;
a stressor subjecting the channel region to different first and second strain levels;
a gate region between the channel region and the stressor;
a first source/drain region; and
a second source/drain region, wherein the channel region is between the first and second source/drain regions and the stressor has a strain level that gradually changes from the first source/drain region to the second source/drain region.

17. A semiconductor device comprising:
a channel region;
a stressor subjecting the channel region to different first and second strain levels; and
a gate region between the channel region and the stressor;
wherein the second strain level is greater than the first strain level and the difference between the first and second strain levels is less than the second strain level.

18. A semiconductor device comprising:
a channel region;
a stressor subjecting the channel region to different first and second strain levels; and
a gate region between the channel region and the stressor;
wherein the first channel section is located between the second channel section and a source, and the second channel section is located between the first channel section and a drain.

19. A semiconductor device comprising:
a channel region;
a stressor subjecting the channel region to different first and second strain levels; and
a gate region between the channel region and the stressor;
wherein the stressor surrounds the channel structure.

20. The semiconductor device of claim 19, further comprising a nanowire structure that includes the channel region.

* * * * *